United States Patent [19]

Nitta

[11] Patent Number: 5,590,145
[45] Date of Patent: Dec. 31, 1996

[54] LIGHT-EMITTING APPARATUS CAPABLE OF SELECTING POLARIZATION DIRECTION, OPTICAL COMMUNICATION SYSTEM, AND POLARIZATION MODULATION CONTROL METHOD

[75] Inventor: Jun Nitta, Tokyo, Japan

[73] Assignee: Canon Kabushiki Kaisha, Tokyo, Japan

[21] Appl. No.: 392,212

[22] Filed: Feb. 22, 1995

[30] Foreign Application Priority Data

Feb. 23, 1994 [JP] Japan ................................. 6-051206
Dec. 12, 1994 [JP] Japan ................................. 6-332106

[51] Int. Cl.$^6$ ................................................. H01S 3/18
[52] U.S. Cl. ........................ 372/50; 372/19; 372/45; 372/38; 372/27
[58] Field of Search ............................ 372/50, 38, 27, 372/19, 45, 43; 385/11

[56] References Cited

U.S. PATENT DOCUMENTS

| | | | |
|---|---|---|---|
| 5,007,063 | 4/1991 | Kahen | 372/45 |
| 5,117,469 | 5/1992 | Cheung et al. | 385/11 |
| 5,155,737 | 10/1992 | Ikeda et al. | 372/43 |
| 5,396,508 | 3/1995 | Bour et al. | 372/50 |
| 5,412,678 | 5/1995 | Treat et al. | 372/50 |

FOREIGN PATENT DOCUMENTS

| | | |
|---|---|---|
| 0543061 | 11/1991 | European Pat. Off. . |
| 62-042593 | 2/1987 | Japan . |
| 62-144426 | 6/1987 | Japan . |
| 05037074 | 7/1991 | Japan . |
| 2267405 | 5/1992 | United Kingdom . |

*Primary Examiner*—Rodney B. Bovernick
*Assistant Examiner*—Yisun Song
*Attorney, Agent, or Firm*—Fitzpatrick, Cella, Harper & Scinto

[57] ABSTRACT

A light-emitting apparatus capable of selecting polarization direction of a light outputted therefrom includes a semiconductor laser and an optical amplifying device. The semiconductor laser is capable of selectively changing a direction of polarization plane of the output light to one of two orthogonal directions by controlling an excited state. The optical amplifying device amplifies the output light from the semiconductor laser. The optical amplifying device has amplification factors with respect to polarized light components in two orthogonal directions.

21 Claims, 7 Drawing Sheets

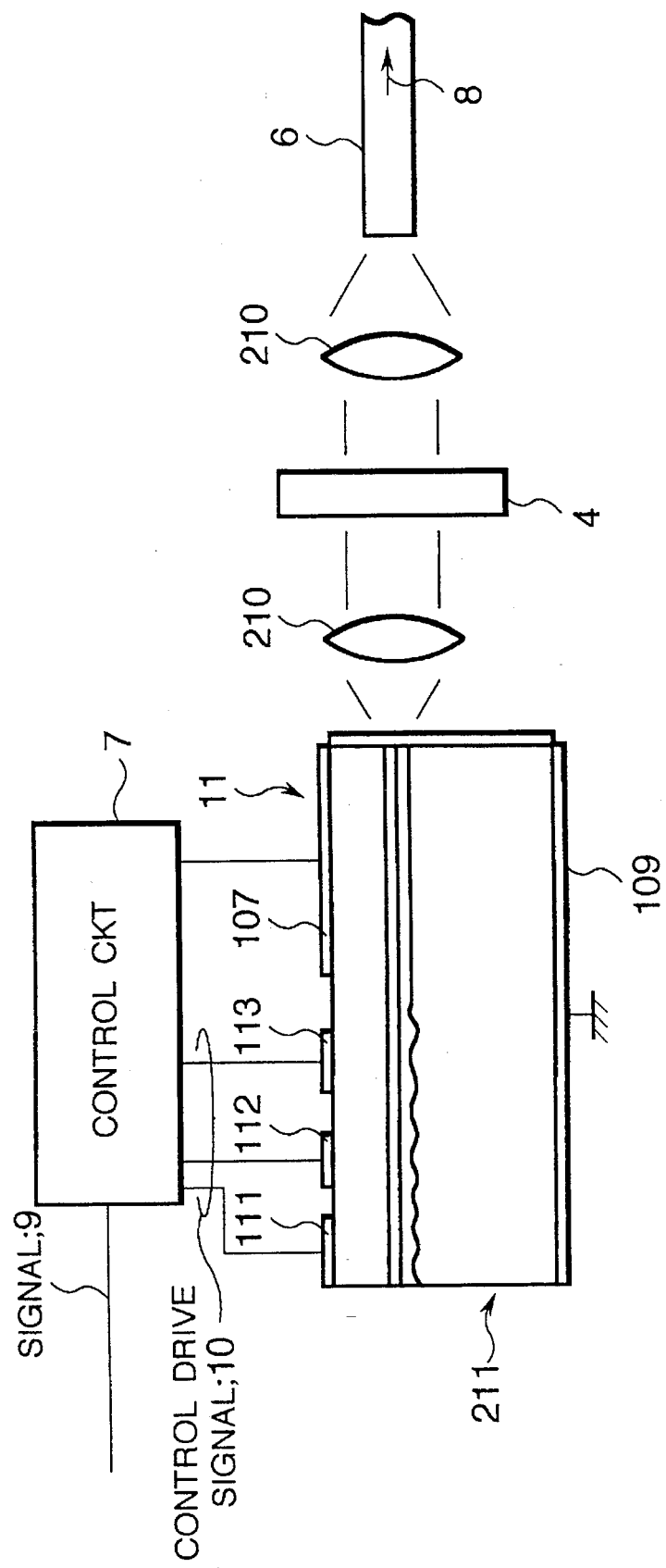

LIGHT-EMITTING APPARATUS CAPABLE OF SELECTING POLARIZATION DIRECTION, OPTICAL COMMUNICATION SYSTEM, AND POLARIZATION MODULATION CONTROL METHOD

BACKGROUND OF THE INVENTION

1. Field of the Invention

The present invention relates to a light-emitting apparatus having a semiconductor laser capable of switching the direction of the plane of polarization of output light between two orthogonal directions by controlling the injection current, and an optical communication system and a polarization modulation control method using this apparatus.

2. Related Background Art

Japanese Laid-Open Patent Application Nos. 62-42593 and 62-144426 have described conventional communication systems using a semiconductor laser (distributed feedback (DFB) semiconductor laser) which switches, by controlling the injection current, the direction of the plane of polarization of output light between so-called TE and TM modes which are perpendicular to each other. In these conventional systems, optical communications are performed by converting a change in the polarization plane into a change in the intensity by the use of a combination of a semiconductor laser which can switch the polarization mode of output light between TE and TM, and a polarization selecting means which transmits the output light of one of the two polarization planes.

In order to stably operate semiconductor lasers which are used in communications of this sort and by which the plane of polarization of output light is changed, APC (Automatic Power Control) that has been conventionally performed for semiconductor lasers is unsatisfactory when it is performed singly, so control for stabilizing the operating point of a semiconductor laser is required. One possible example of this control method is to separate a portion of the output light into TE polarized light and TM polarized light, convert these two light components into electrical signals, and control a semiconductor laser by using the two electrical signals.

Unfortunately, the above conventional method has the following drawbacks since the control operation is done by using a portion of the output light from a semiconductor laser which can change the plane of polarization of output light by controlling the injection current.

(1) Since a portion of the output light is used, an optical system for this purpose is necessary (the system is complicated).

(2) If this branching optical system is integrated with a semiconductor laser, an excess loss takes place (the loss increases).

SUMMARY OF THE INVENTION

It is, therefore, an object of the present invention to provide a light-emitting apparatus capable of controlling, with a small loss and a simple arrangement, a light-emitting means such as a semiconductor laser which can modulate the plane of polarization, and a transmitter, an optical communication system, and a polarization modulation control method using the apparatus.

In the light-emitting apparatus according to the present invention, output light from a light-emitting means, such as a semiconductor laser, which can change the plane of polarization of the output light by controlling the injection current, is amplified by an optical amplifying means, such as a semiconductor optical amplifier, which has polarization dependence in the amplification characteristics. The operating point of the light-emitting means such as a semiconductor laser is controlled by using a change or variation in the voltage between the terminals of the optical amplifying means upon the amplification. This makes it possible to reduce the loss with a simpler arrangement than conventional ones, thereby improving the degree of freedom in designing the light-emitting means such as a semiconductor laser. That is, DBR (Distributed Reflection) and FP (Fabry-Pérot) lasers can also used as a semiconductor laser in addition to the DFB laser.

One aspect of the present invention provides a light-emitting apparatus which comprises light-emitting means capable of selectively changing a direction of a polarization plane of output light to one of two orthogonal directions by controlling an excited state, and optical amplifying means for amplifying the output light from said light-emitting means, and wherein said optical amplifying means having different amplification factors with respect to polarized light components in the two orthogonal directions.

Another aspect of the present invention provides a light-emitting apparatus which comprises light-emitting means capable of selectively changing a direction of a polarization plane of output light to one of two orthogonal directions by controlling an excited state;

optical amplifying means for amplifying the output light from said light-emitting means, said optical amplifying means having different amplification factors with respect to polarized light components in the two orthogonal directions; and control means for detecting a change in a voltage between terminals of said optical amplifying means and controlling the operation of said light-emitting means on the basis of the detection signal.

Another aspect of the present invention provides an optical communication system which comprises:

an optical transmission line;
  an optical transmitter; and
  an optical receiver,
  wherein said optical transmitter comprising:
    light-emitting means capable of selectively changing a direction of a polarization plane of output light to one of two orthogonal directions by controlling an excited state;
    optical amplifying means for amplifying the output light from said light-emitting means, said optical amplifying means having different amplification factors with respect to polarized light components in the two orthogonal directions; and
    control means for detecting a change in a voltage between terminals of said optical amplifying means and controlling the operation of said light-emitting means on the basis of the detection signal.

Another aspect of the present invention provides a polarization modulation control method for an optical transmitter having light-emitting means which performs modulation by selectively changing a direction of a polarization plane of output light to one of two orthogonal directions by controlling an excited state, which method comprises the steps of:

inputting the output light from said light-emitting means to optical amplifying means having different amplification factors with respect to polarized light components in the two orthogonal directions;

detecting a change in a voltage between terminals of said optical amplifying means; and controlling the light-emitting operation of said light-emitting means on the basis of the detection signal.

BRIEF DESCRIPTION OF THE DRAWINGS

FIG. 7 is a view showing an arrangement in which the device of the second embodiment of the present invention is applied to a transmitter for use in optical communications.

DESCRIPTION OF THE PREFERRED EMBODIMENTS

Figure 1:
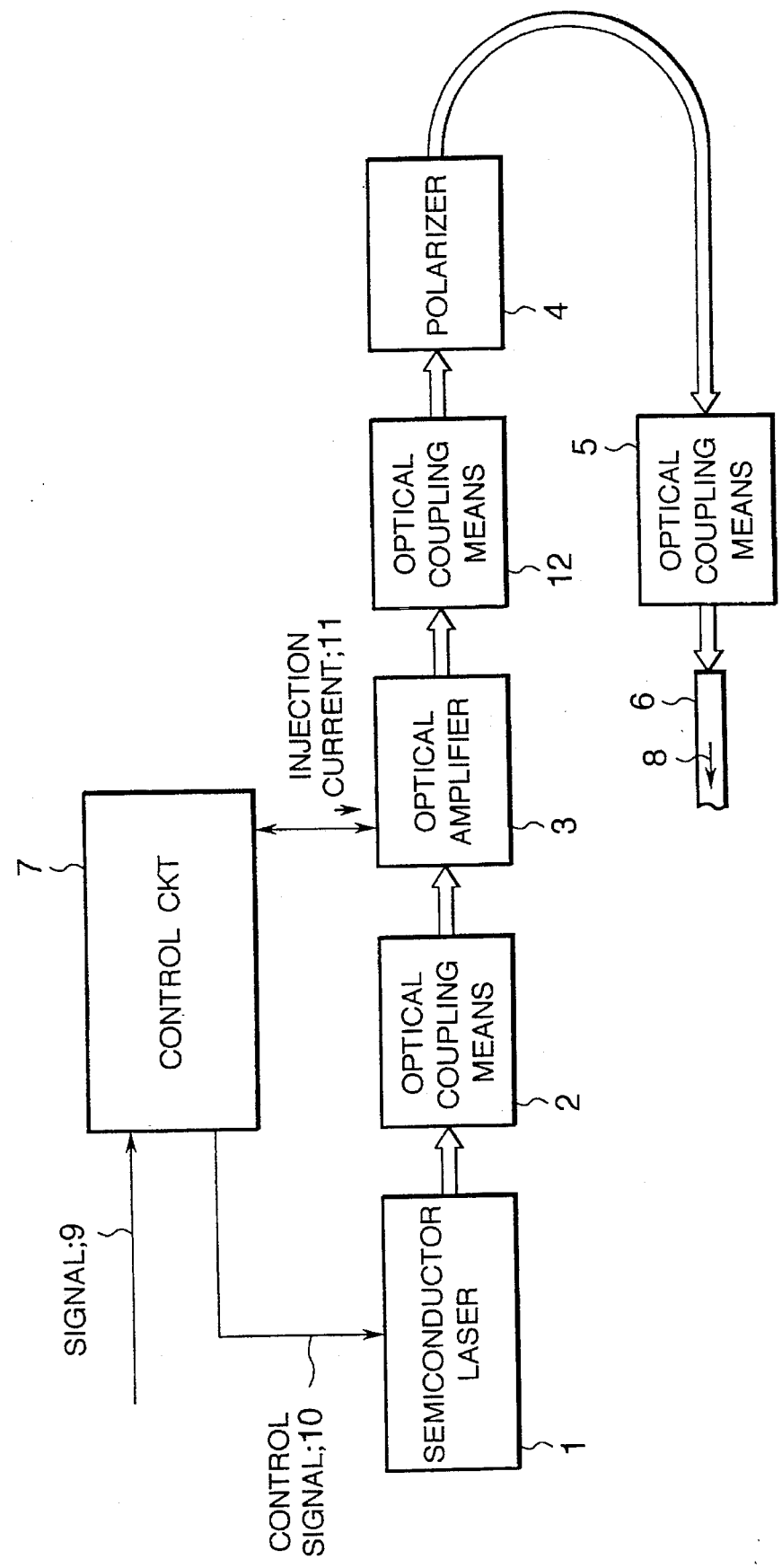
FIG. 1 is a block diagram showing the arrangement of the first embodiment of the present invention.

FIG. 1 is a block diagram best illustrating the feature of the first embodiment of the present invention. This first embodiment comprises a semiconductor laser 1, an optical coupling means 2, an optical amplifier 3, a polarizer 4, an optical coupling means 5, an optical fiber 6, a control circuit 7, and another optical coupling means 12. The polarized light of output light from the semiconductor laser 1 can be switched between TE and TM by controlling the injection current. The optical amplifier 3 has an amplification factor which is polarization-dependent. The optical coupling means 2 is, e.g., an optical system for coupling the output light from the semiconductor laser 1 to the optical amplifier 3. Of the output light from the optical amplifier 3, the polarizer 4 transmits only light having a specific polarization. The optical coupling means 5 couples the light transmitted through the polarizer 4 to the optical fiber 6. An electrical signal 9 to be transmitted is input to the control circuit 7. An optical signal 8 is transmitted through the optical fiber 6. The optical coupling means 12 couples the output light from the optical amplifier 3 to the polarizer 4.

As the semiconductor laser 1, it is possible to use a distributed feedback semiconductor laser having a configuration as described in, e.g., Japanese Laid-Open Patent Application No. 62-42593. As the optical amplifier 3, a so-called traveling-wave semiconductor laser amplifier is used. This amplifier is fabricated by forming antireflection films on the two end faces of a Fabry-Pérot semiconductor laser having an active layer which has a gain with respect to the output wavelength of the semiconductor laser 1. The optical amplifier 3 of this type has an amplification factor which is polarization-dependent due to the asymmetry of a waveguide and to the polarization dependence of the gain of an active region. In this embodiment, a layer having a multiple quantum well configuration is used as the active layer of the optical amplifier 3. The optical amplifier 3 exhibits an amplification factor of about 20 Db with respect to TE-mode light, and that of about 13 dB with respect to TM-mode light. In the arrangement illustrated in FIG. 1, the TE mode from the semiconductor laser 1 is coupled with the TE mode of the optical amplifier 3. The polarizer 4 is so designed as to transmit the TE mode of the output light (amplified light) from the optical amplifier 3 (it is also possible to transmit only the TM mode).

The operation of this embodiment will be described below.

The control circuit 7 outputs a drive current including a control signal 10 to the semiconductor laser 1. The resulting output light is applied to the optical amplifier 3. Upon injection of a current 11 from the control circuit 7, the optical amplifier 3 amplifies the input optical signal. By this amplification action, a change is produced in the voltage between the terminals of the optical amplifier 3. Since a layer with a multiple quantum well configuration is used as the active layer of the optical amplifier 3, the degree of this voltage change when the input light is TE light differs from that when the input light is TM light (the change is larger for TE light). Consequently, assuming the polarized state of the output light from the semiconductor laser 1 is a train of pulses, FIG. 2A, constituted by TE light and TM light, the voltage across the optical amplifier 3 changes as illustrated in FIG. 2B. The control circuit 7 can control the bias point of the semiconductor laser 1 by controlling the semiconductor laser 1 using this voltage change such that the voltage pattern is held constant.

Details of the above operation will be described below.

Figure 3:
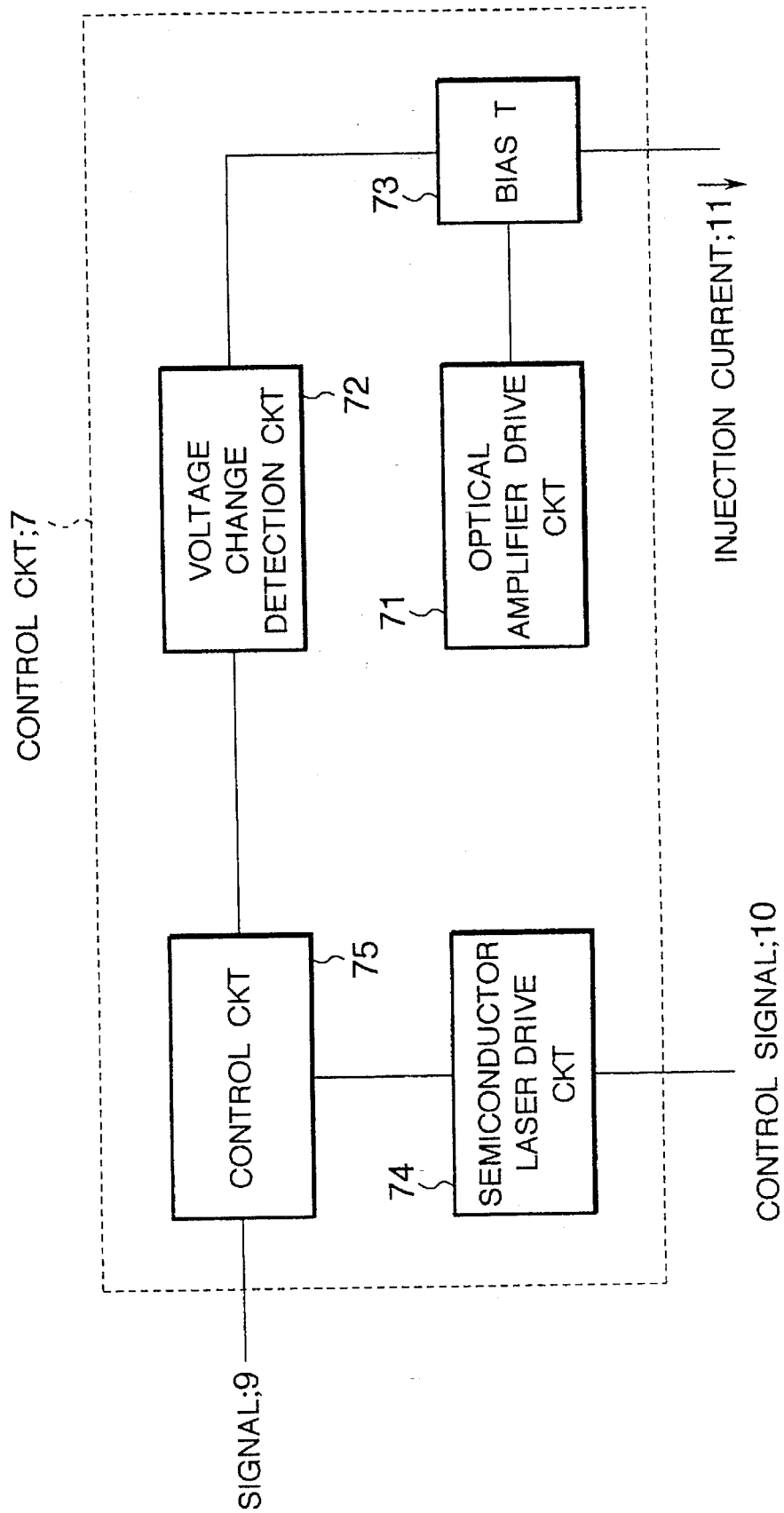
FIG. 3 is a block diagram showing the arrangement of a control circuit 7 in FIG. 1.

The control circuit 7 has circuitry for detecting a voltage change occurring between the terminals of the optical amplifier 3 when the optical amplifier 3 amplifies light. Circuitry of this sort can detect the voltage change by using a circuit (bias T) consisting of a coil and a capacitor while flowing the injection current 11. FIG. 3 shows the configuration of this circuitry. As in FIG. 3, the control circuit 7 includes a drive circuit 71 for the optical amplifier 3, a voltage change detection circuit 72, a DC-AC coupler 73 (bias T), a drive circuit 74 for the semiconductor laser 1, and a control circuit 75 for controlling the drive circuit 74 for the semiconductor laser 1 on the basis of an output from the voltage change detection circuit 72. In this embodiment the optical amplifier drive circuit 71 is so operated as to inject a constant current into the optical amplifier 3.

Figure 4:
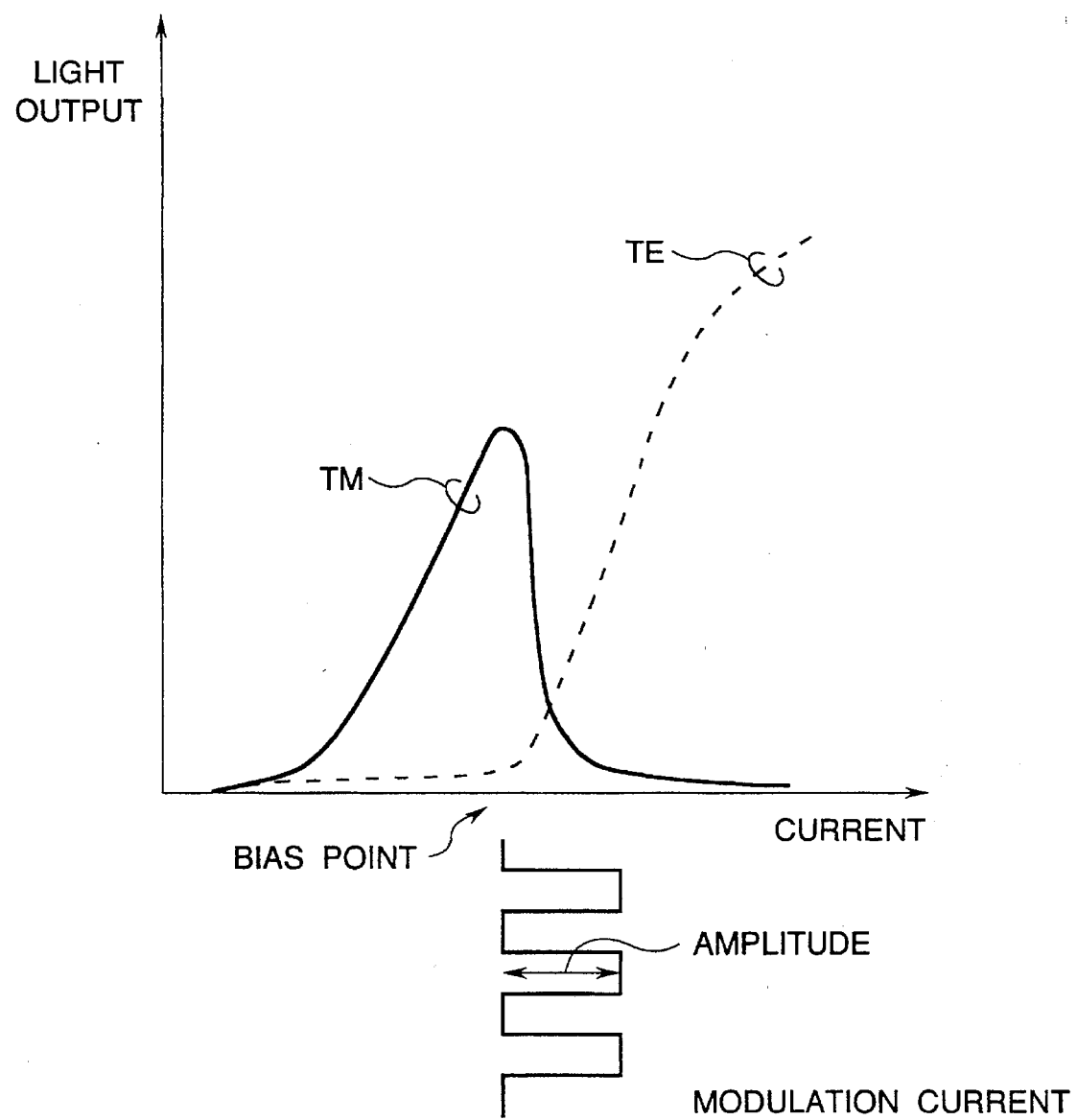
FIG. 4 is a graph showing the characteristics of a semiconductor laser in FIG. 1.

The semiconductor laser 1 used in this embodiment has the characteristics, FIG. 4, in which the direction of polarization of oscillated light is switched between TE and TM depending on the injection current 11.

In a modulation method in which the polarized state of output light is changed between two orthogonal directions, only a small drive current (modulation current) is necessary for the modulation, so a high extinction ratio can be obtained. Therefore, the bias point and the amplitude of the modulation current must be set properly. In the characteristics as shown in FIG. 4, TM light is output at the bias point, and TE light is output when pulses of the modulation current are present. Therefore, the control circuit 7 so controls the semiconductor laser 1 that the output TE light is minimized at the bias point, the output TM light is minimized when pulses are present, and the pulse amplitude used in the modulation is minimized at the operating point.

Figure 2A:
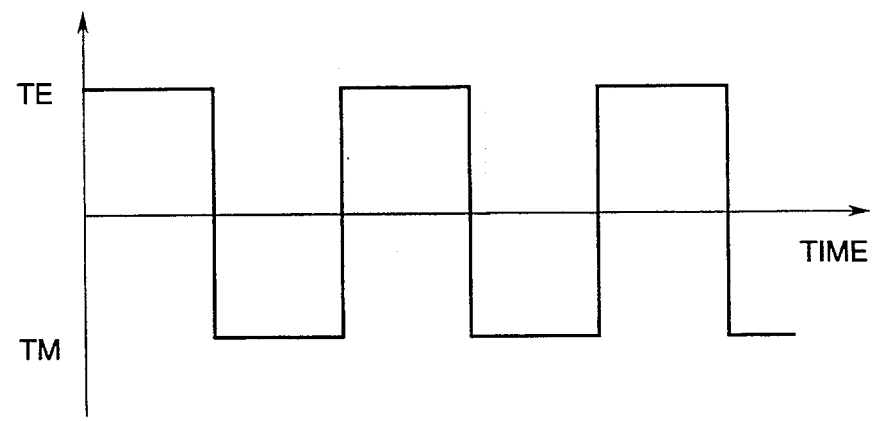
FIGS. 2A and 2B are timing charts for explaining the operation of the first embodiment of the present invention.
Figure 2B:
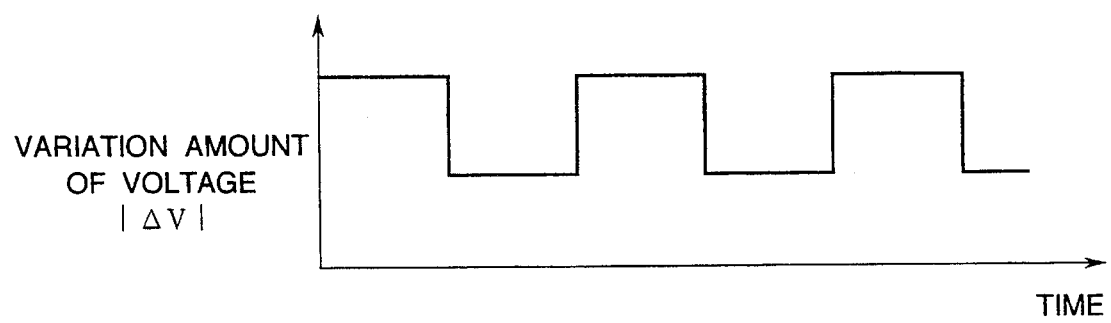

For this control, signals corresponding to the TE and TM modes, FIG. 2A, are detected. One example of the control method using these signals is a method by which pulses having a fixed pulse amplitude are injected into the semiconductor laser 1 while the bias current is gradually increased from a zero-bias-current state, and the resultant voltage change in the optical amplifier 3 is detected. When the bias current is changed in this way, the voltage change in the optical amplifier 3 which corresponds to the optical pulses is also pulsed. The pulse amplitude of this pulsed voltage gradually increases as the TE and TM light components mix more and more. The amplitude of the pulses is at a maximum at the operating point as discussed above. Thereafter, the TE light becomes dominant, and the pulse amplitude decreases. It is, therefore, only necessary to fix the driving conditions to this maximum-amplitude state.

In this case, it is also possible to set the bias point and the pulse amplitude more accurately by monitoring voltage changes in the optical amplifier 3 while changing the pulse amplitude of the current (e.g., gradually changing the amplitude from small values to large values) and also changing the bias current for each pulse amplitude.

Figure 5:
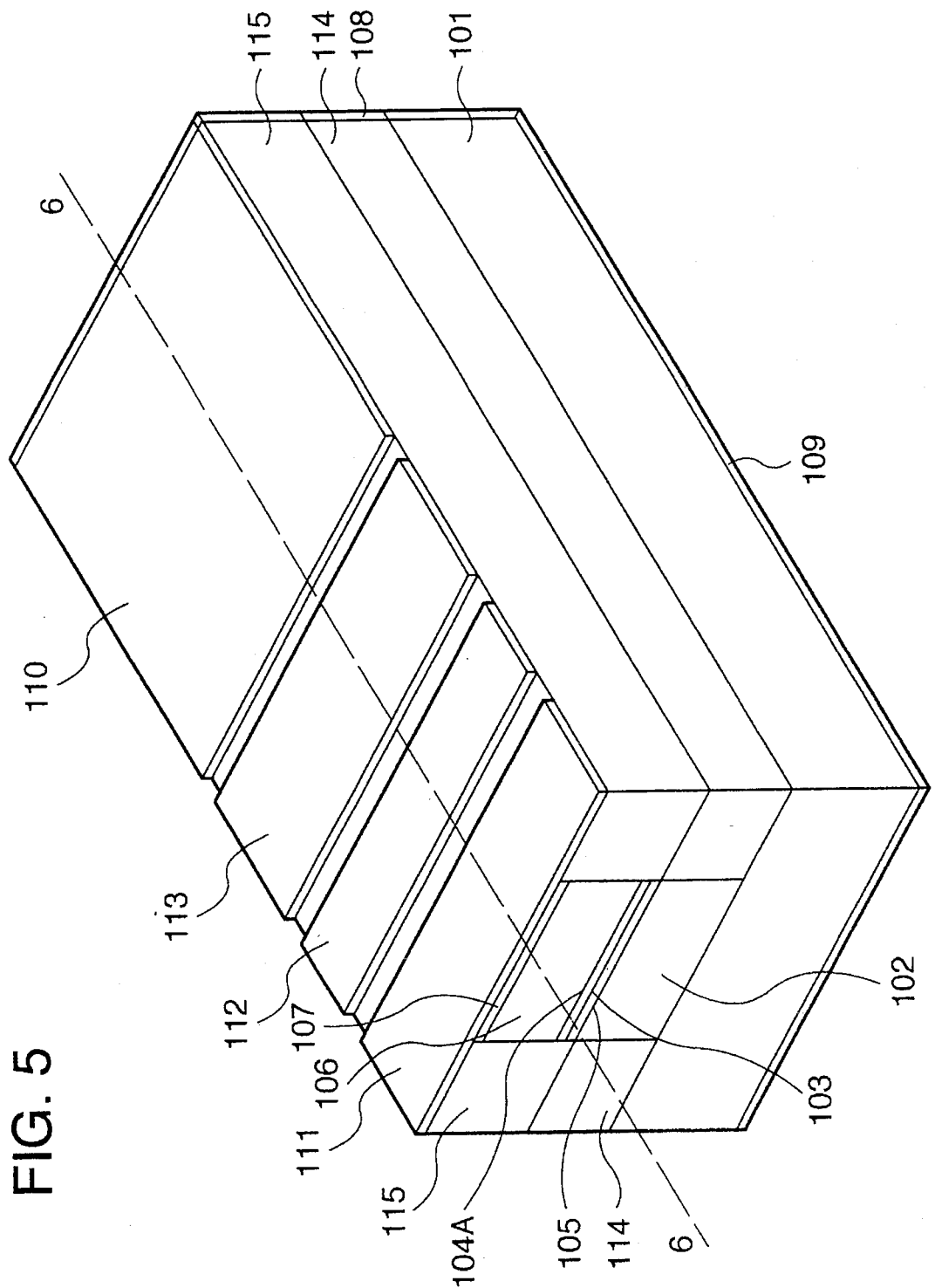
FIG. 5 is a perspective view showing the arrangement of a device according to the second embodiment of the present invention.
Figure 6:
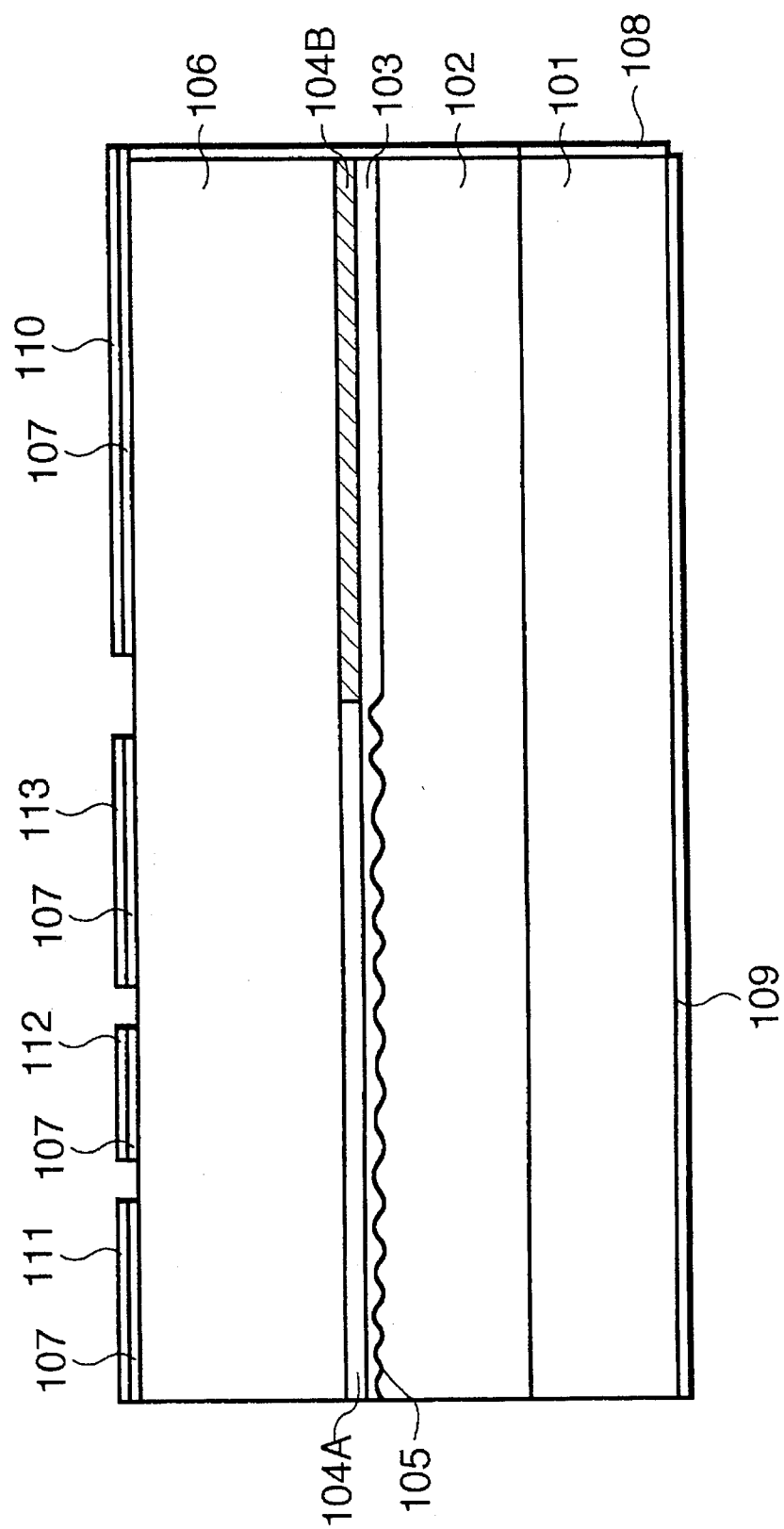
FIG. 6 is a sectional view taken along the line 6—6 in FIG. 5.

The second embodiment of the present invention is illustrated in FIGS. 5 to 7.

FIGS. 5 and 6 are views showing the arrangement of a device of the second embodiment. FIG. 7 is a view for explaining how to use this device.

The device configuration will be described first. FIG. 6 is a sectional view taken along the line 6—6 in FIG. 5. Referring to FIGS. 5 and 6, this device comprises a substrate 101 made from, e.g., n-type InP, a first cladding layer 102 made from, e.g., n-type InP, an optical guide layer 103, a strained multiple quantum well 104A, and a grating 105. The optical guide layer 103 has a thickness of about 0.2 μm and is constructed from n-type $In_{0.71}Ga_{0.29}As_{0.62}P_{0.38}$. The strained multiple quantum well 104A is constituted by 10 alternating layers of, e.g., $In_{0.53}Ga_{0.47}As$ (thickness 5 nm) and $In_{0.28}Ga_{0.72}As$ (thickness 5 nm). The gating 105 is formed in a portion of the interface between the first cladding layer 101 and the optical guide layer 103. The device also comprises a second cladding layer 106 constructed from, e.g., p-type InP, a cap layer 107 constructed from, e.g., p+-type InP, an antireflection film 108, electrodes 109 to 113, a first buried layer 114 consisting of, e.g., p-type InP, a second buried layer 115 consisting of, e.g., n-type InP, and an active layer 104B of an optical amplifier. Unlike the active layer of the strained multiple quantum well 104A, the optical amplifier active layer 104B consists of a strain-free multiple quantum well and is constituted by alternating layers of GainAsP (thickness 200 Å, composition 1.3 μm)/ $Ga_{0.47}In_{0.53}As$ (thickness 60 Å). Although not shown in FIG. 6, another antireflection film can be formed on the end face on the DFB laser side.

In the device with the configuration as described above, a region in which the grating 105 is formed corresponds to the semiconductor laser 1 of the first embodiment, and the active layer 104B corresponds to the optical amplifier of the first embodiment. In this device, the polarization direction of output light can be switched between TE and TM by changing an injection current to the second electrode 112 of the DFB laser while a constant bias current is injected into the first and third electrodes 111 and 113 of the DB laser. That is, with this current change the threshold gain or the like at the Bragg wavelength with respect to the TE and TM modes is changed, thereby switching the polarization direction of output light between TE and TM.

This device is essentially the same as the first embodiment in the operations corresponding to the semiconductor laser 1, the optical coupling means 2, and the optical amplifier 3 of the first embodiment. That is, when the light from the DFB laser is supposed to be TE or TM light, whether this is true is checked by detecting the voltage change in the optical amplifier. If this is not true, a control circuit 7 controls the DFB laser by adjusting the bias current to be injected into the first and third electrodes 111 and 113 of the DFB laser or by adjusting the change in the current to be injected into the second electrode 112.

FIG. 7 shows an arrangement in which the device of this embodiment is applied to an optical transmitter or a transmission unit of an optical transmitter/receiver. In FIG. 7, this arrangement includes a device 211 according to the second embodiment, and lenses 210 as the optical coupling means 5 and 12 shown in FIG. 1. The other parts are identical with those of the first embodiment.

The operation of the above arrangement will be described below.

Upon receiving an electrical signal 9 from the terminal, the control circuit 7 sends a pulse signal corresponding to the electrical signal 9 to the DBF second electrode 112. In accordance with this pulse signal, the DFB laser outputs light which is switched between the TE and TM modes. At this time a fixed bias current is injected into the first and third electrodes 111 and 113 of the DFB laser. This output light propagates to the optical amplifier region and is amplified in that region. When the amplification action is performed for the optical signal, a voltage change occurs in this optical amplifier region (such as in FIG. 2B). On the basis of this voltage change, the control circuit 7 performs control such that the operating point of the DFB laser is stabilized. In this case, the current injection state in which the TE or TM mode is obtained is checked beforehand, and, on the basis of this information, the control circuit 7 performs the operating point stabilization control for the DFB laser. The output optical signal from the optical amplifier is collimated by the lens 210. 0f the resultant collimated light, a polarizer 4 transmits only TE light to yield light that is modulated in intensity. This intensity-modulated light is coupled to an optical fiber 6 through the lens 210 and transmitted. Since this optical signal is an intensity-modulated signal, it can be received by a conventionally used optical receiver for intensity modulation.

It is also possible to properly increase the number of electrodes of the semiconductor laser, thereby making the arrangement capable of changing the oscillation wavelength and at the same time switching the polarized states of output light. In this case the apparatus can be used as a wavelength multiple transmitter.

The optical transmission portion discussed herein is also applicable to an optical CATV and optical LAN, as well as to a simple optical communication system connecting two points, provided that the system deals with a light-intensity-modulated signal.

In the above embodiments, an active layer of a quantum well structure is used as the optical amplifier to give the amplification factor polarization dependence, and thereby the detection voltage is obtained. However, the arrangement of the optical amplifier is not limited to this active layer. As an example, a strained quantum well into which a compression strain is introduced can be used to form a structure having a larger gain with respect to TE-polarized light than in conventional quantum well structures. It is also possible to form a structure having a large amplification factor with respect to TM-polarized light by using a strained quantum well into which a tensile strain is introduced. Furthermore, an active layer having a bulk structure, rather than a quantum well structure, is also usable. In this case the amplification factor can be given polarization dependence by the asymmetry of a waveguide structure.

As has been discussed above, the present invention makes use of a light-emitting means such as a DFB, DBR (distributed reflection), or FP (Fabry-Pérot) semiconductor laser capable of changing the plane of polarization of output light by changing the injection current, an optical amplifying means such as a semiconductor optical amplifier whose amplification factor has polarization dependence, and means or circuit for controlling the operating point of the light-emitting means such as semiconductor laser on the basis of the voltage change when the optical amplifying means performs amplification. Consequently, the light-emitting means such as a semiconductor laser can be controlled with a smaller loss and a simpler arrangement than in conventional systems.

What is claimed is:

1. A light-emitting apparatus comprising:
   light-emitting means capable of selectively changing a direction of a polarization plane of output light to one of two orthogonal directions by controlling an excited state; and
   optical amplifying means for amplifying the output light from said light-emitting means, said optical amplifying means having different amplification factors with respect to polarized light components in the two orthogonal directions; and
   control means for detecting a change in a voltage between terminals of said optical amplifying means and controlling operation of said light-emitting means based on detection signal so that said light emitting means selectively changes the direction of the polarization plane of output light to one of the two orthogonal directions.

2. An apparatus according to claim 1, wherein
   said light-emitting means emits light upon injection of a superposed current of a bias current for light emission and a pulse current for selecting polarized light components in TE and TM modes, and
   said control means controls at least one of a value of the bias current and an amplitude of the pulse current such that a value of the voltage between the terminals when the pulse current is injected is a value of the voltage between the terminals when one of the TE mode and TM mode light components is input to said amplifying means, and a value of the voltage between the terminals when the pulse current is not injected is a value of the voltage between the terminals when the other of the TE mode and TM mode light component is input to said amplifying means.

3. An apparatus according to claim 1, wherein
   said light-emitting means emits light upon injection of a superposed current of a bias current for light emission and a pulse current for selecting polarized light components in the two orthogonal directions, and
   said control means controls at least one of a value of the bias current and an amplitude of the pulse current such that an amplitude of the change in the voltage between the terminals of said optical amplifying means is held at a maximum amplitude.

4. An apparatus according to claim 1, wherein said light-emitting means is a semiconductor laser.

5. An apparatus according to claim 4, wherein said semiconductor laser is a distributed feedback semiconductor laser.

6. An apparatus according to claim 4, wherein said semiconductor laser has an active layer constituted by a strained quantum well.

7. An apparatus according to claim 1, wherein said optical amplifying means is a semiconductor optical amplifier.

8. An apparatus according to claim 7, wherein said semiconductor optical amplifier has an active layer constituted by a strained quantum well.

9. An apparatus according to claim 1, wherein said light-emitting means is a semiconductor laser, and said optical amplifying means is a semiconductor optical amplifier, said semiconductor laser and said semiconductor optical amplifier being integrated on a single semiconductor substrate.

10. An apparatus according to claim 1, further comprising polarization selecting means for transmitting one of the two orthogonal polarized light components which are output from said optical amplifying means.

11. An optical communication system comprising:
    an optical transmission line;
    an optical transmitter; and
    an optical receiver,
    said optical transmitter comprising:
      light-emitting means capable of selectively changing a direction of a polarization plane of output light to one of two orthogonal directions by controlling an excited state;
      optical amplifying means for amplifying the output light from said light-emitting means, said optical amplifying means having different amplification factors with respect to polarized light components in the two orthogonal directions; and
      control means for detecting a change in a voltage between terminals of said optical amplifying means and controlling operation of said light-emitting means based on a detection signal so that said light emitting means selectively changes the direction of the polarization plane of output light to one of the two orthogonal directions.

12. A polarization modulation control method for an optical transmitter having light-emitting means which performs modulation by selectively changing a direction of a polarization plane of output light to one of two orthogonal directions by controlling an excited state, comprising the steps of:
    inputting the output light from the light-emitting means to optical amplifying means having different amplification factors with respect to polarized light components in the two orthogonal directions;
    detecting a change in a voltage between terminals of the optical amplifying means; and
    controlling light-emitting operation of the light-emitting means based on a detection signal so that the light emitting means selectively changes the direction of the polarization plane of output light to one of the two orthogonal directions.

13. A method according to claim 12, wherein
    said light-emitting means emits light upon injection of a superposed current of a bias current for light emission and a pulse current for selecting polarized light components in TE and TM modes, and
    the light-emitting operation control step controls at least one of a value of the bias current and an amplitude of the pulse current such that a value of the voltage between the terminals when the pulse current is injected is a value of the voltage between the terminals when one of the TE mode and TM mode light components is input to the amplifying means, and a value of the voltage between the terminals when the pulse current is not injected is a value of the voltage between the terminals when the other of the TE mode and TM mode light component is input to the amplifying means.

14. A method according to claim 11, wherein
    said light-emitting means emits light upon injection of a superposed current of a bias current for light emission and a pulse current for selecting polarized light components in the two orthogonal directions, and the light-emitting operation control step controls at least one of a value of the bias current and an amplitude of the pulse current such that an amplitude of the change in the voltage between the terminals of said optical amplifying means is held at a maximum amplitude.

15. An optical communication system according to claim 11, said light-emitting means comprising a semiconductor laser.

16. An optical communication system according to claim 15, said semiconductor laser comprising a distributed feedback semiconductor laser.

17. An optical communication system according to claim 15, said semiconductor laser comprising an active layer constituted by a strained quantum well.

18. An optical communication system according to claim 11, said optical amplifying means comprising a semiconductor optical amplifier.

19. An optical communication system according to claim 18, said semiconductor optical amplifier comprising an active layer constituted by a strained quantum well.

20. An optical communication system according to claim 11, said light-emitting means comprising a semiconductor laser, and said optical amplifying means comprising a semiconductor optical amplifier, said semiconductor laser and said semiconductor optical amplifier being integrated on a single semiconductor substrate.

21. An optical communication system according to claim 11, further comprising polarization selecting means for transmitting one of the two orthogonal polarized light components which are output from said optical amplifying means.

* * * * *

UNITED STATES PATENT AND TRADEMARK OFFICE
CERTIFICATE OF CORRECTION

PATENT NO. : 5,590,145
DATED : December 31, 1996
INVENTOR(S) : Nitta

It is certified that error appears in the above-indentified patent and that said Letters Patent is hereby corrected as shown below:

COLUMN 2:

Line 11, "(Fabry-P" should read --(Fabry- --;
Line 12, "érot)" should read --Pérot)--;
Line 20, "having" should read --has--; and
Line 41, "comprising:" should read --comprises:--.

COLUMN 5:

Line 27, "gating" should read --grating--;
Line 32, "p+-type" should read --p$^+$-type--; and
Line 39, "GainAsP" should read --GaInAsP--.

COLUMN 6:

Line 28, "0f" should read --Of--.

COLUMN 8:

Line 64, "method" should read --system--.

Signed and Sealed this

Tenth Day of June, 1997

Attest:

BRUCE LEHMAN

*Attesting Officer*     *Commissioner of Patents and Trademarks*